(12) United States Patent
Hashii (10) Patent No.: US 11,532,901 B2
(45) Date of Patent: Dec. 20, 2022

(54) ELECTRICAL DEVICE

(71) Applicant: Mitsubishi Electric Corporation, Tokyo (JP)

(72) Inventor: Naoya Hashii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 156 days.

(21) Appl. No.: 17/264,549

(22) PCT Filed: Oct. 2, 2018

(86) PCT No.: PCT/JP2018/036863
§ 371 (c)(1),
(2) Date: Jan. 29, 2021

(87) PCT Pub. No.: WO2020/070797
PCT Pub. Date: Apr. 9, 2020

(65) Prior Publication Data
US 2021/0313716 A1 Oct. 7, 2021

(51) Int. Cl.
*H01R 9/24* (2006.01)
*H01R 13/629* (2006.01)
*H01R 31/08* (2006.01)

(52) U.S. Cl.
CPC ............. *H01R 9/24* (2013.01); *H01R 13/629* (2013.01); *H01R 31/08* (2013.01); *H01R 2201/26* (2013.01)

(58) Field of Classification Search
CPC ......... H01R 9/24; H01R 13/629; H01R 31/08

(Continued)

(56) References Cited

U.S. PATENT DOCUMENTS 8,579,655 B2 * 11/2013 Kawamura ........ H01R 13/6315
439/353
8,864,504 B1 * 10/2014 Gretz ...................... H01R 4/66
439/100

(Continued)

FOREIGN PATENT DOCUMENTS

JP 2012-234744 A 11/2012
JP 2014-166043 A 9/2014

OTHER PUBLICATIONS

International Search Report for PCT/JP2018/036863, dated Dec. 25, 2018.

*Primary Examiner* — Alexander Gilman
(74) *Attorney, Agent, or Firm* — Sughrue Mion, PLLC; Richard C. Turner (57) ABSTRACT

In an electrical device, a terminal block includes a mounting hole portion formed so as to be opened in a bottom surface and a mounting bore which is formed so as to be opened in a top surface, and connects the mounting hole portion and an outside of the top surface to each other, the swing-side interlock connector includes a swing-side housing which is mounted inside the mounting hole portion, and protrudes from the mounting bore, a cover is placed on the top surface of the terminal block by fitting a fitting hole to a protruding portion (31a) of the swing-side housing protruding from the mounting bore, and a gap portion which is formed around the protruding portion (31a), and connects the mounting hole portion and the outside of the top surface to each other is covered with the cover as viewed from the side of the housing opening portion.

8 Claims, 10 Drawing Sheets

(58) Field of Classification Search
USPC .......................................................... 439/709
See application file for complete search history.

(56) References Cited

U.S. PATENT DOCUMENTS

| | | | | |
|---|---|---|---|---|
| 9,022,807 | B2* | 5/2015 | Uno | H01R 13/648 |
| | | | | 439/607.55 |
| 9,024,183 | B2* | 5/2015 | Sakakura | H01R 13/6315 |
| | | | | 174/50.5 |
| 9,059,534 | B2* | 6/2015 | Endo | H01R 13/5205 |
| 2021/0313716 | A1* | 10/2021 | Hashii | H01R 13/629 |
| 2022/0102879 | A1* | 3/2022 | Kim | H01R 13/629 |
| 2022/0271468 | A1* | 8/2022 | Dawson | H01R 13/428 |

* cited by examiner

ELECTRICAL DEVICE

CROSS REFERENCE TO RELATED APPLICATIONS

This application is a National Stage of International Application No. PCT/JP2018/036863 filed Oct. 2, 2018.

TECHNICAL FIELD

The present invention relates to an electrical device to which a terminal block provided with interlock connectors is mounted.

BACKGROUND ART

In an on-vehicle power conversion device, a terminal block for DC current input and output and AC current input and output is provided. Moreover, terminals of external harnesses inserted from an outside into a housing are fastened to the terminal block with bolts so as to be fixed. For that purpose, a housing opening portion is formed in a direction orthogonal to an insertion direction of the external harnesses into the housing so that a tool for fastening the bolts can be inserted into the housing. Further, after the terminals of the external harnesses are fastened to the terminal block with bolts so as to be fixed, the housing opening portion is closed by a waterproof lid including a sealing member, and gaps between the external harnesses and the housing are closed by flanges including sealing members, thereby preventing entry of water, dust, and the like into the housing from the housing opening portion.

In such a power conversion device, when the waterproof lid is removed from the housing, the terminal block is exposed. Therefore, as part of safety measures, there has been provided an interlock circuit configured to switch an electrical circuit in the device to a current OFF state when the waterproof lid is removed from the housing in a state in which a current is supplied between the external harnesses and the terminal block. Moreover, there has been proposed a related-art power conversion device including interlock connectors forming a part of the interlock circuit, which are mounted to the waterproof lid side and the terminal block side (for example, see Patent Literature 1).

Further, when a power conversion device is assembled to a vehicle on an assembly line of an automobile manufacturer and when the power conversion device is repaired or inspected at a dealership, there have been such problems that a control circuit board is damaged due to an accidental contact of a tool for fastening the bolts and an electrical circuit is short-circuited due to entry of conductive foreign matter such as metal powder. Therefore, there has been proposed a related-art power conversion device having the two-layer cover structure in which the control circuit board is covered with a first cover, and a terminal block provided with a fuse for overcurrent protection for a DC current flowing to accessories connected to the power conversion device and a terminal block provided with the interlock connectors are covered with a second cover for sealing a housing (for example, see Patent Literature 2).

CITATION LIST

Patent Literature

[PTL 1] JP 2012-234744 A
[PTL 2] JP 2014-166043 A

SUMMARY OF INVENTION

Technical Problem

In the related-art power conversion device described in Patent Literature 1, when a swing side of the interlock connectors is mounted to the terminal block, a gap for a swing is required between the terminal block and the interlock connector. Moreover, when the interlock connector is fixed through snap-fit to the resin-molded terminal block, in terms of a mold configuration, it is required that a hole passing through a front surface and a rear surface of the terminal block be formed in the terminal block as an undercut portion used to mold claws for the snap-fit fixing.

Moreover, in the related-art power conversion device described in Patent Literature 2, there are required a gap between the first cover and the terminal block for the fuse and a gap between the first cover and the terminal block for the interlock connector in order to absorb dimensional tolerances and assembly tolerances of respective components.

During repair and inspection such as attachment and detachment of external harnesses and replacement of a fuse, conductive foreign matter such as threading chips may accidentally be dropped on the terminal block. When the above-mentioned gap and hole are present, the conductive foreign matter dropped on the terminal block may enter the power conversion device from the gap and the hole, and may cause a short-circuit in a circuit on a circuit board and a short-circuit between terminals of power semiconductor elements.

The present invention has been made to solve the above-mentioned problem, and has an object to achieve an electrical device capable of preventing entry of conductive foreign matter into an inside of a housing, which causes a short-circuit in a circuit on a circuit board and a short-circuit between terminals of power semiconductor elements.

Solution to Problem

An electrical device according to the present invention includes: a housing; a terminal block which is provided in the housing, and includes an electrical connection portion on a top surface; an external harness having a terminal fastened with bolts to the electrical connection portion so as to be fixed to the terminal block in a state in which the external harness is inserted into the housing; a housing opening portion formed in the housing so as to be opposed to the top surface of the terminal block, and to expose the electrical connection portion; a lid mounted to the housing so as to close the housing opening portion; a swing-side interlock connector mounted to the terminal block; and a fixed-side interlock connector mounted to the lid, and configured to bring harnesses connected to the swing-side interlock connector into a short-circuit state when the lid is mounted to the housing, and to release the short-circuit state between the harnesses when the lid is removed from the housing. The terminal block includes a mounting hole portion which is formed so as to be opened in a bottom surface and a mounting bore formed so as to be opened in the top surface, and connects the mounting hole portion and an outside of the top surface to each other, and the swing-side interlock connector includes a swing-side housing which is mounted inside the mounting hole portion, and protrudes from the mounting bore, a cover is placed on the top surface of the terminal block by fitting a fitting hole to a protruding portion of the swing-side housing protruding from the mounting bore, and a gap portion which is formed around the protruding portion, and connects the mounting hole portion and the outside of the top surface to each other is covered with the cover as viewed from the side of the housing opening portion.

Advantageous Effects of Invention

According to the present invention, the gap portion which is formed around the protruding portion of the swing-side housing protruding from the mounting bore, and connects the mounting hole portion and the outside of the top surface of the terminal block to each other is covered with the cover as viewed from the side of the housing opening portion. Thus, even when conductive foreign matter such as threading chips may accidentally be dropped on the terminal block during repair and inspection such as attachment and detachment of external harnesses, the conductive foreign matter is prevented from entering the inside of the housing from the gap connecting the mounting hole portion and the top surface of the terminal block to each other. As a result, there is provided such an effect that the short-circuit is prevented in the circuit on the circuit board and between the terminals of the power semiconductor elements inside the housing.

DESCRIPTION OF EMBODIMENTS

First Embodiment

Figure 1:
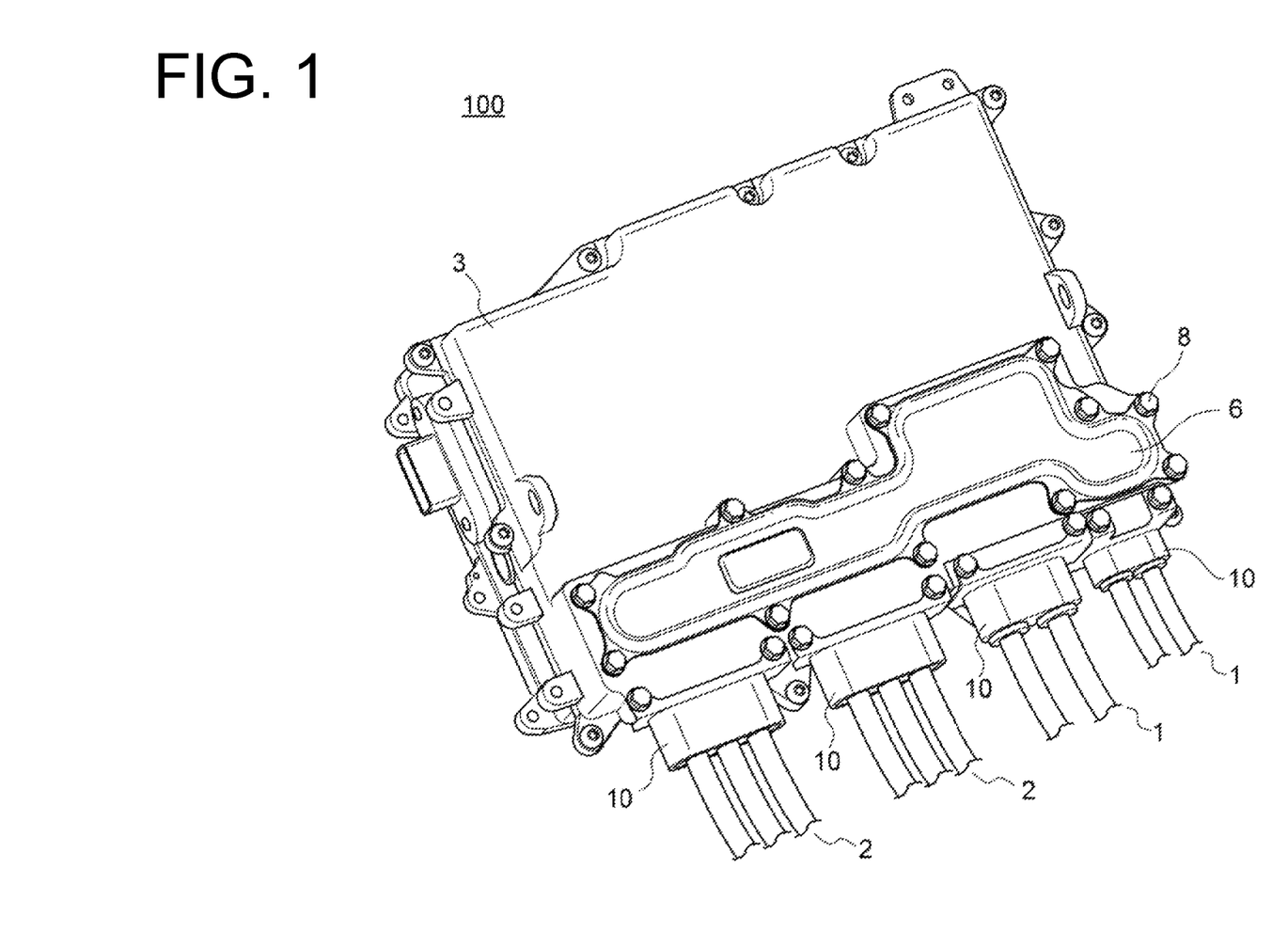
FIG. 1 is a perspective view for illustrating a power conversion device according to a first embodiment of the present invention.
Figure 2:
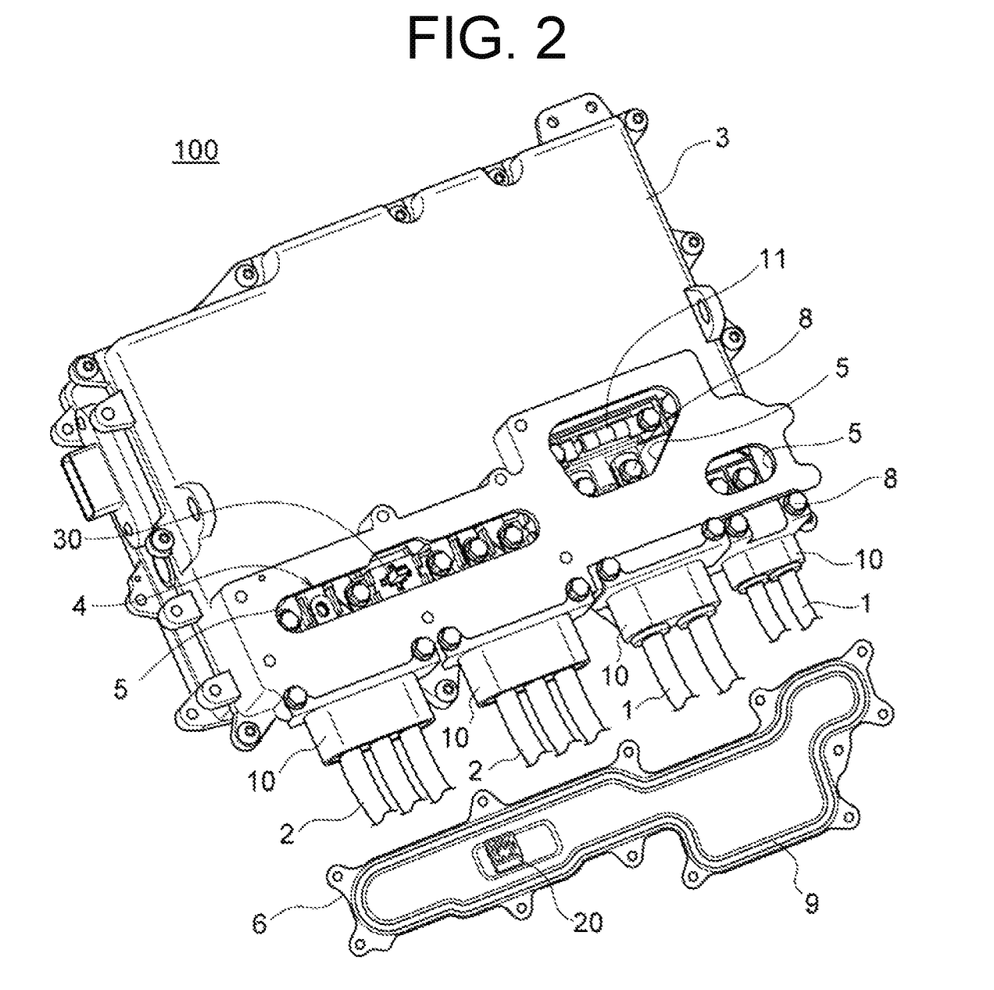
FIG. 2 is a perspective view for illustrating a state in which a waterproof lid configured to close housing opening portions is removed in the power conversion device according to the first embodiment of the present invention.
Figure 3:
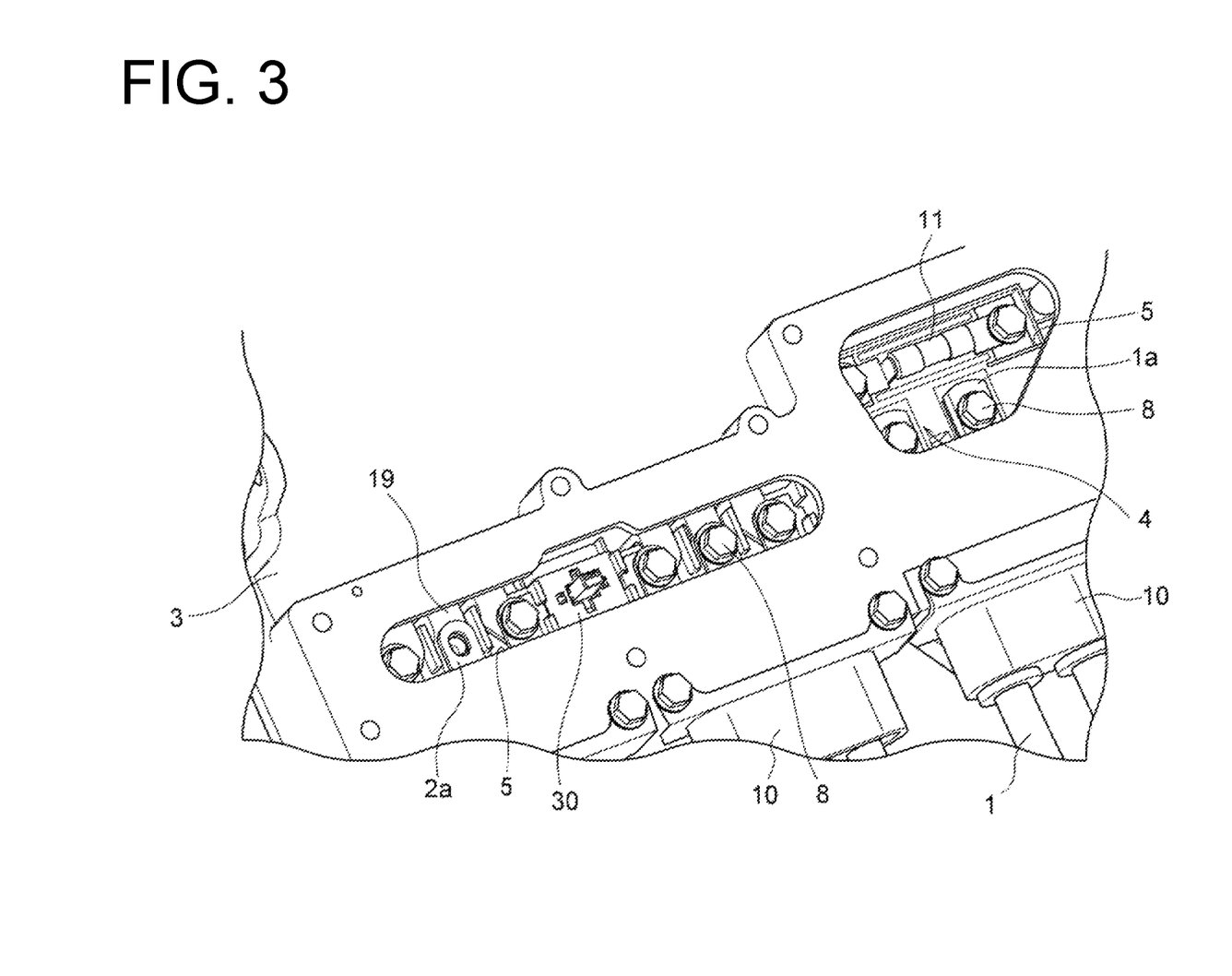
FIG. 3 is an enlarged view of a main part for illustrating a periphery of the opening portions of the power conversion device according to the first embodiment of the present invention.
Figure 4:
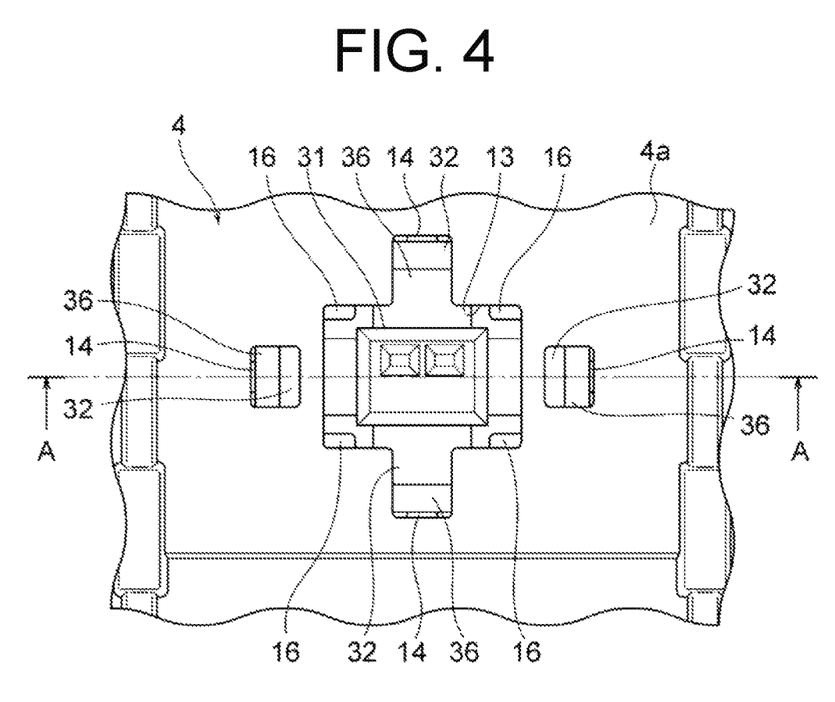
FIG. 4 is an enlarged view of a main part for illustrating a periphery of an interlock connector fitted to a terminal block in the power conversion device according to the first embodiment of the present invention.
Figure 5:
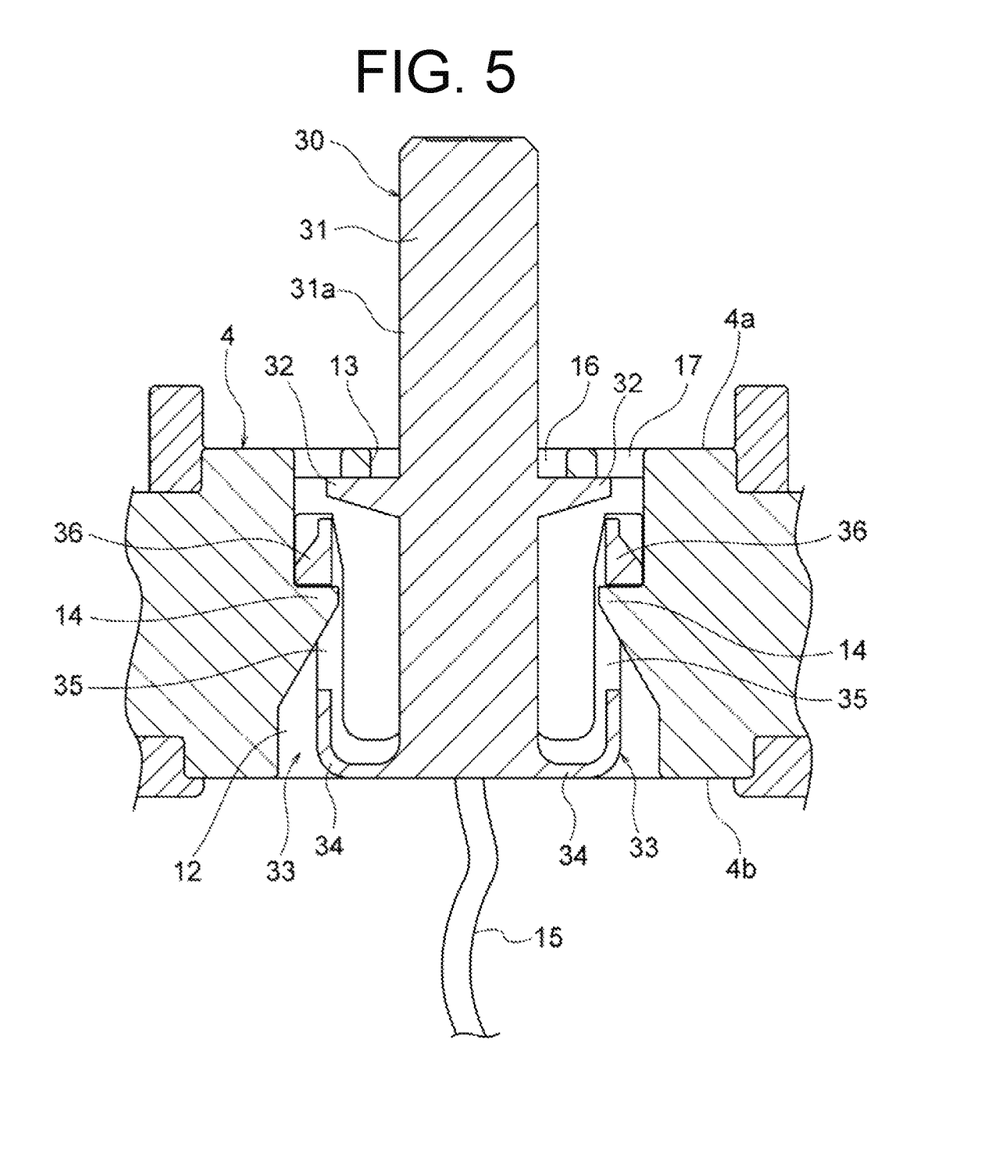
FIG. 5 is a sectional view taken along the arrow line A-A of FIG. 4.
Figure 6:
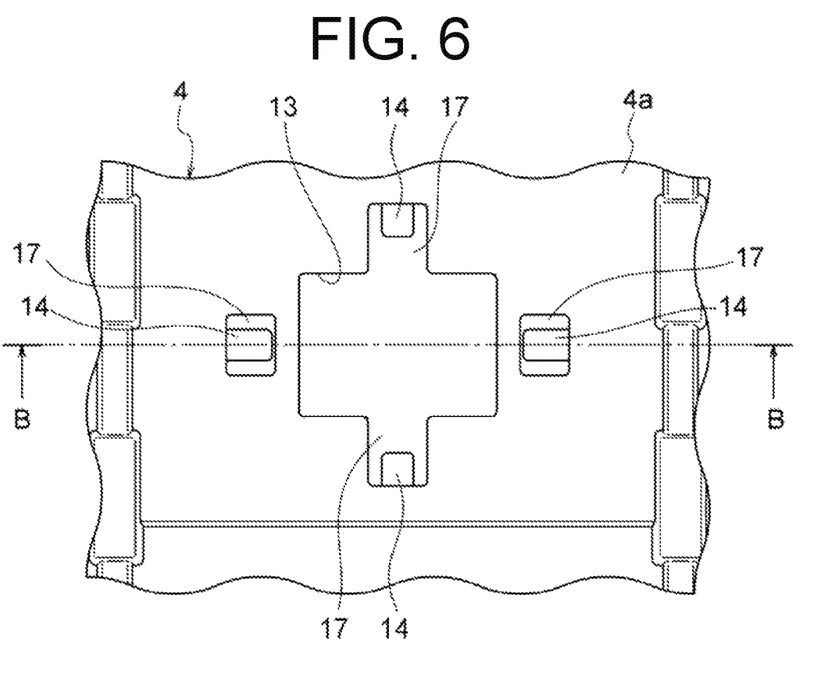
FIG. 6 is an enlarged view of a main part for illustrating a periphery of the terminal block before the interlock connector is fitted in the power conversion device according to the first embodiment of the present invention.
Figure 7:
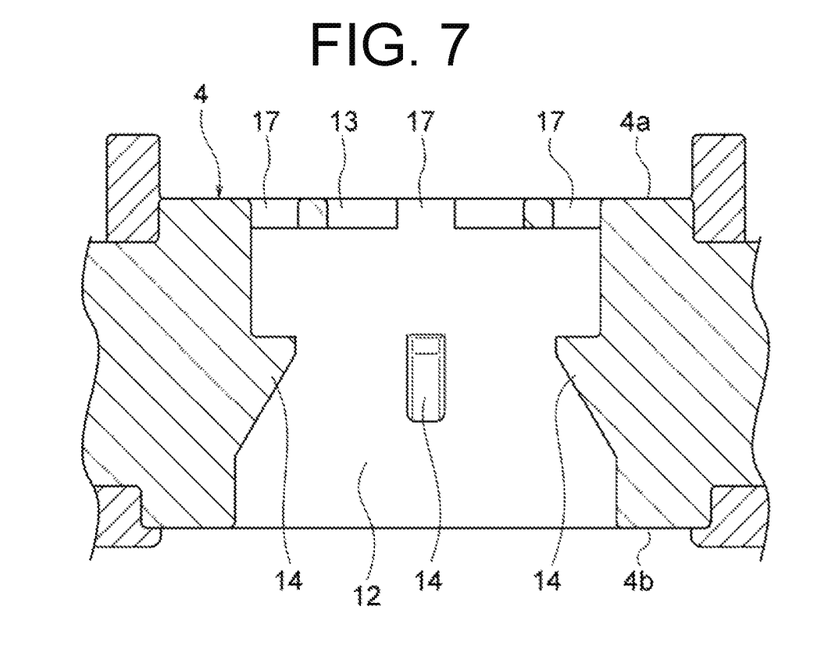
FIG. 7 is a sectional view taken along the arrow line B-B of FIG. 6.
Figure 8:
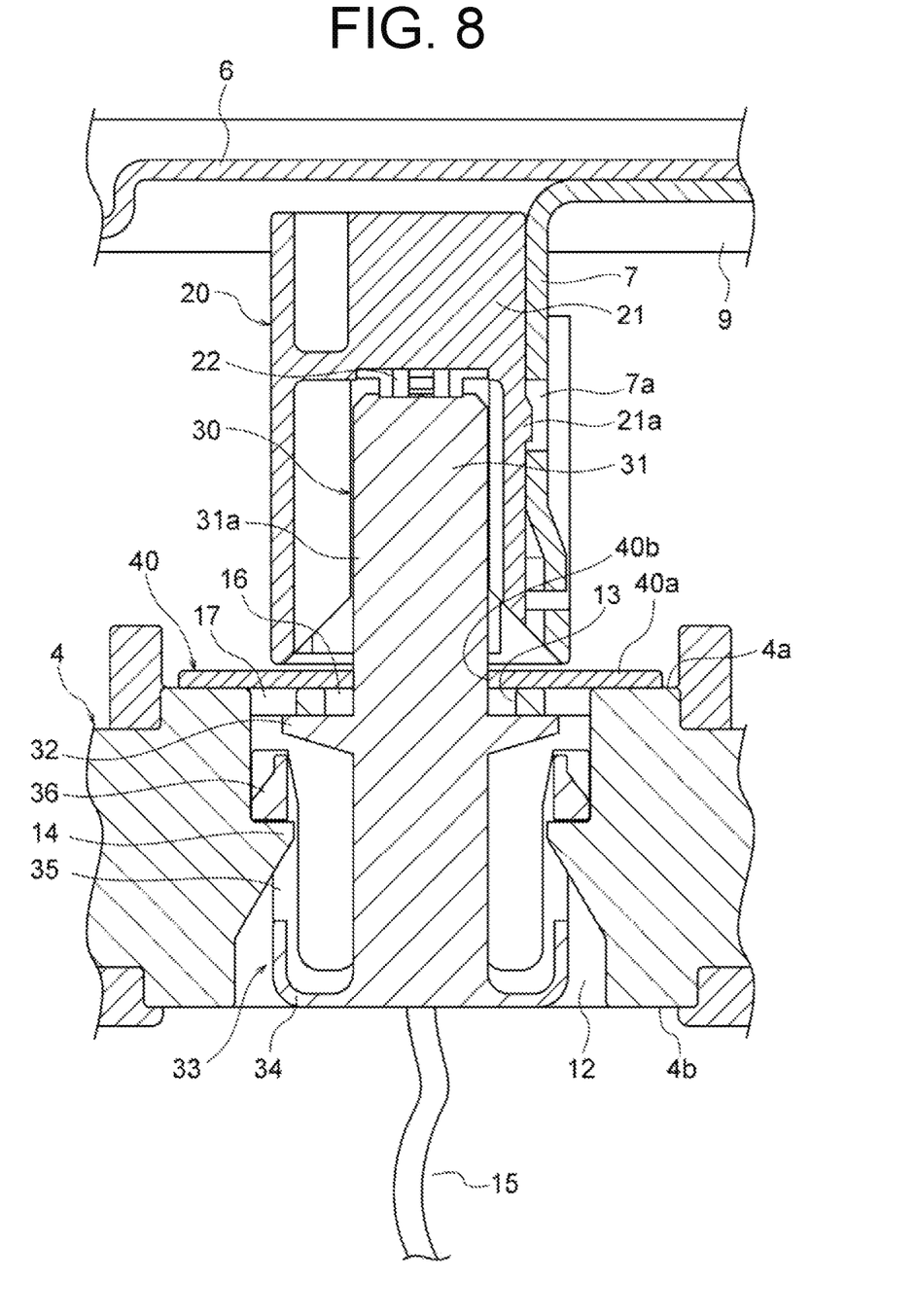
FIG. 8 is a sectional view for illustrating the dustproof structure of the terminal block in the power conversion device according to the first embodiment of the present invention.

FIG. 1 is a perspective view for illustrating a power conversion device according to a first embodiment of the present invention. FIG. 2 is a perspective view for illustrating a state in which a waterproof lid configured to close housing opening portions is removed in the power conversion device according to the first embodiment of the present invention. FIG. 3 is an enlarged view of a main part for illustrating a periphery of the opening portions of the power conversion device according to the first embodiment of the present invention. FIG. 4 is an enlarged view of a main part for illustrating a periphery of an interlock connector fitted to a terminal block in the power conversion device according to the first embodiment of the present invention. FIG. 5 is a sectional view taken along the arrow line A-A of FIG. 4. FIG. 6 is an enlarged view of a main part for illustrating a periphery of the terminal block before the interlock connector is fitted in the power conversion device according to the first embodiment of the present invention. FIG. 7 is a sectional view taken along the arrow line B-B of FIG. 6. FIG. 8 is a sectional view for illustrating the dustproof structure of the terminal block in the power conversion device according to the first embodiment of the present invention.

In FIG. 1 to FIG. 3, a power conversion device 100 serving as an electrical device includes a housing 3, a terminal block 4, external harnesses 1 and 2, a waterproof lid 6, and flanges 10. The terminal block 4 is provided inside the housing 3. The external harnesses 1 and 2 are connected to the terminal block 4. A power conversion circuit, a control circuit board, and the like (not shown) are accommodated in the housing 3. The power conversion circuit is configured to convert a DC current to an AC current and to convert an AC current to a DC current, and is formed of power semiconductor elements. The control circuit board is configured to control the power semiconductor elements. The power conversion device 100 is an on-vehicle power conversion device. The external harnesses 1 are harnesses for inputting and outputting DC currents. The external harnesses 2 are harnesses for inputting and outputting AC currents.

The external harnesses 1 and 2 are inserted into the housing 3. Moreover, the external harnesses 1 and 2 have terminals 1a and 2a, respectively, fastened with bolts 8 to electrical connection portions 19 provided on a top surface of the terminal block 4 in a direction orthogonal to the insertion direction into the housing 3, so as to be fixed to the terminal block 4. Thus, housing opening portions 5 are formed in a portion of the housing 3 orthogonal to the insertion direction of the external harnesses 1 and 2 into the housing 3, that is, a top surface of the housing 3. As a result, the housing opening portions 5 are formed so as to be opposed to the top surface of the terminal block 4, and to expose the electrical connection portions 19 of the terminal block 4. Thus, when the external harnesses 1 and 2 are fixed to the terminal block 4, a bolt fastening tool can be inserted from the housing opening portions 5 into the housing 3. The waterproof lid 6 is mounted to the top surface of the housing 3 such that an elastic sealing member 9 having a shape to surround the housing opening portions 5 is arranged between the waterproof lid 6 and the housing 3, and the waterproof lid 6 is fastened with the bolts 8 to the housing 3 so as to close the housing opening portions 5. As a result, entry of water, dust, and the like from the housing opening portions 5 into the housing 3 is prevented. The flanges 10 each including an elastic sealing member are mounted to the housing 3 such that gaps between the external harnesses 1 and 2 and the housing 3 are closed. As a result, water, dust, and the like are prevented from entering the housing 3 from the gaps between the external harnesses 1 and 2 and the housing 3.

Moreover, a fuse 11 is mounted to the terminal block 4 for overcurrent protection for a DC current flowing to accessories connected to the on-vehicle power conversion device 100.

Further, for the on-vehicle power conversion device 100, an interlock circuit is provided. The interlock circuit is configured to switch an electrical circuit in the housing 3 to a current OFF state when the waterproof lid 6 is removed from the housing 3 in a state in which currents are supplied between the external harnesses 1 and 2 and the electrical connection portions 19 of the terminal block 4. Moreover, a fixed-side interlock connector 20 of interlock connectors forming a part of the interlock circuit is provided inside the waterproof lid 6. Further, a swing-side interlock connector 30 of the interlock connectors is provided in the terminal block 4.

With reference to FIG. 4 to FIG. 8, description is now given of configurations of the fixed-side interlock connector 20 and the swing-side interlock connector 30.

A stay 7 is formed by bending a metal plate into an L shape, and is fixed to the waterproof lid 6 so as to protrude at the right angle from an inner surface of the waterproof lid 6. A fitting bore 7a is formed in a distal end portion of the stay 7 protruding at the right angle from the waterproof lid 6. The fixed-side interlock connector 20 includes a fixed-side housing 21 and a short-circuit terminal 22. The fixed-side housing 21 has a hollow on a bottom end side. The short-circuit terminal 22 is fixed to a bottom portion of the hollow portion of the fixed-side housing 21. The fixed-side interlock connector 20 is mounted to the waterproof lid 6 by fitting a fitting protrusion 21a formed on the fixed-side housing 21 to the fitting bore 7a of the stay 7 so that a top end side of the fixed-side interlock connector 20 is directed toward the inner surface of the waterproof lid 6.

A mounting hole portion 12 is formed in the terminal block 4. The mounting hole portion 12 of a recessed shape is rectangular in cross-section, and is opened in a bottom surface 4b. A mounting bore 13 is formed so as to pass through a bottom portion of the mounting hole portion 12. The mounting bore 13 is opened in a top surface 4a of the terminal block 4, and connects the mounting hole portion 12 and the outside of the top surface 4a to each other. Holding claw portions 14 for snap-fit fixing are formed so as to be opposed to respective pairs of inner wall surfaces of the mounting hole portion 12 opposed to each other.

The swing-side interlock connector 30 includes a swing-side housing 31. The swing-side housing 31 is formed into a columnar body that has a rectangular shape in cross-section so as to be insertable into the hollow portion of the fixed-side housing 21 and the mounting bore 13. Although illustration is not given, female terminals are formed inside a top end of the swing-side housing 31 in a state in which the female terminals are connected to harnesses 15. Extension pieces 32 rise from four side surfaces of the swing-side housing 31 at the right angle, and are able to be in surface-contact from below with an inner wall surface of a peripheral edge portion of the mounting bore 13. Each flexible piece 33 rises at the right angle from a bottom end of each side surface of the swing-side housing 31, and further extends upward in a posture parallel with a side surface of the swing-side housing 31 up to a position below the extension piece 32. The flexible piece 33 includes a pair of arms 35 and a hook portion 36. The pair of arms 35 extend upward from a base end portion 34. The hook portion 36 couples distal end portions of the pair of arms 35 to each other. The flexible piece 33 is configured to elastically deform so as to swing about the base end portion 34. Moreover, a region surrounded by the base end portion 34, the pair of arms 35, and the hook portion 36 serves as a holding bore to which the holding claw portion 14 is fitted.

The swing-side housing 31 of the swing-side interlock connector 30 configured as described above is inserted from below into the mounting hole portion 12. After that, the swing-side housing 31 is caused to protrude from the mounting bore 13. The extension pieces 32 are brought into the surface contact state with the inner wall surface of the peripheral edge portion of the mounting bore 13. Each flexible piece 33 elastically deforms such that the hook portion 36 comes into abutment against the holding claw portion 14, to thereby be displaced toward the side surface side of the swing-side housing 31 about the base end portion 34 in the course of the insertion of the swing-side housing 31 into the mounting hole portion 12. After that, when the hook portions 36 have passed over the holding claw portions 14, the flexible pieces 33 are restored such that the hook portions 36 separate apart from the side surfaces of the swing-side housing 31. As a result, the holding claw portions 14 are fitted into the holding bores of the flexible pieces 33, and the swing-side interlock connector 30 is consequently fixed to the terminal block 4.

As illustrated in FIG. 8, when the waterproof lid 6 is fixed to the housing 3, the short-circuit terminal 22 of the fixed-side interlock connector 20 is inserted into a female terminal of the swing-side interlock connector 30, and the harnesses 15 are consequently short-circuited, that is, are brought into an electrically connected state. As a result, the interlock circuit is formed, and the electrical circuit in the housing 3 is brought into the state in which the current can be supplied. Moreover, the short-circuit terminal 22 is pulled out from the female terminal by removing the waterproof lid 6, and the short-circuit between the harnesses 15, that is, the electrically connected state is released. As a result, the interlock circuit is disconnected, and the electrical circuit in the housing 3 is brought into the state in which the current cannot be supplied.

In the on-vehicle power conversion device 100 configured as described above, a gap 16 is formed between the mounting bore 13 of the terminal block 4 and the swing-side housing 31 of the swing-side interlock connector 30 to absorb a displacement between the fixed-side interlock connector 20 and the swing-side interlock connector 30. Moreover, the terminal block 4 is a resin molded body, and the holding claw portions 14 for the snap-fit fixing are formed by molding on the terminal block 4. Thus, in terms of a mold configuration, holes 17 passing through the top surface 4a and the bottom surface 4b of the terminal block 4 are formed in order to mold the holding claw portions 14 each having an undercut shape. The gap 16 and the holes 17 are a gap portion which is formed on an outer peripheral side of a protruding portion 31a of the swing-side housing 31 protruding from the mounting bore 13, and connects the mounting hole portion 12 and the outside of the top surface 4a to each other, and thus forms an entry path of foreign matter into the housing 3.

With reference to FIG. 8, description is now given of the dustproof structure of the terminal block 4.

The cover 40 is, for example, a resin molded body, and includes a shielding portion 40a and a fitting hole 40b. The shielding portion 40a has a flat plate shape, and a size to completely cover the mounting bore 13 and the holes 17. The fitting hole 40b is formed in a center portion of the shielding portion 40a, and is to be fitted to the protruding portion 31a of the swing-side housing 31 protruding from the mounting bore 13. Moreover, the cover 40 is mounted to the swing-side interlock connector 30 by pushing the protruding portion 31a of the swing-side housing 31 of the swing-side interlock connector 30 mounted to the terminal block 4 into the fitting hole 40b. The shielding portion 40a is arranged in a state in which the shielding portion 40a is in contact with the top surface 4a of the terminal block 4. As a result, the shielding portion 40a completely covers the gap 16 and the holes 17 as the top surface 4a of the terminal block 4 is seen from above.

In the dustproof structure of the terminal block 4 configured as described above, the shielding portion 40a completely covers the gap 16 and the holes 17 in the state in which the shielding portion 40a is in contact with the top surface of the terminal block 4. Therefore, even when conductive foreign matter such as threading chips falls on the terminal block 4 during repair and inspection operation such as attachment and detachment of the external harnesses 1 and 2 and replacement of the fuse 11 performed while the waterproof lid 6 is removed, the conductive foreign matter is prevented from entering the inside of the housing 3 from the gap 16 and the holes 17. As a result, it is possible to suppress an occurrence of a short-circuit in the circuit on the circuit board and between terminals of the power semiconductor elements caused by the entry of the conductive foreign matter.

Moreover, the swing-side housing 31 is press-fitted to the fitting hole 40b of the cover 40, to come into a state in which an outer wall surface of the swing-side housing 31 and an inner wall surface of the fitting hole 40b of the cover 40 are in contact with each other. Thus, even when the swing-side interlock connector 30 moves for positioning with respect to the fixed-side interlock connector 20, the cover 40 moves together with the swing-side housing 31. Therefore, the gap between the cover 40 and the swing-side housing 31 does not increase, and conductive foreign matter such as threading chips does not thus enter the inside of the housing 3 from the gap between the cover 40 and the swing-side housing 31.

Second Embodiment

Figure 9:
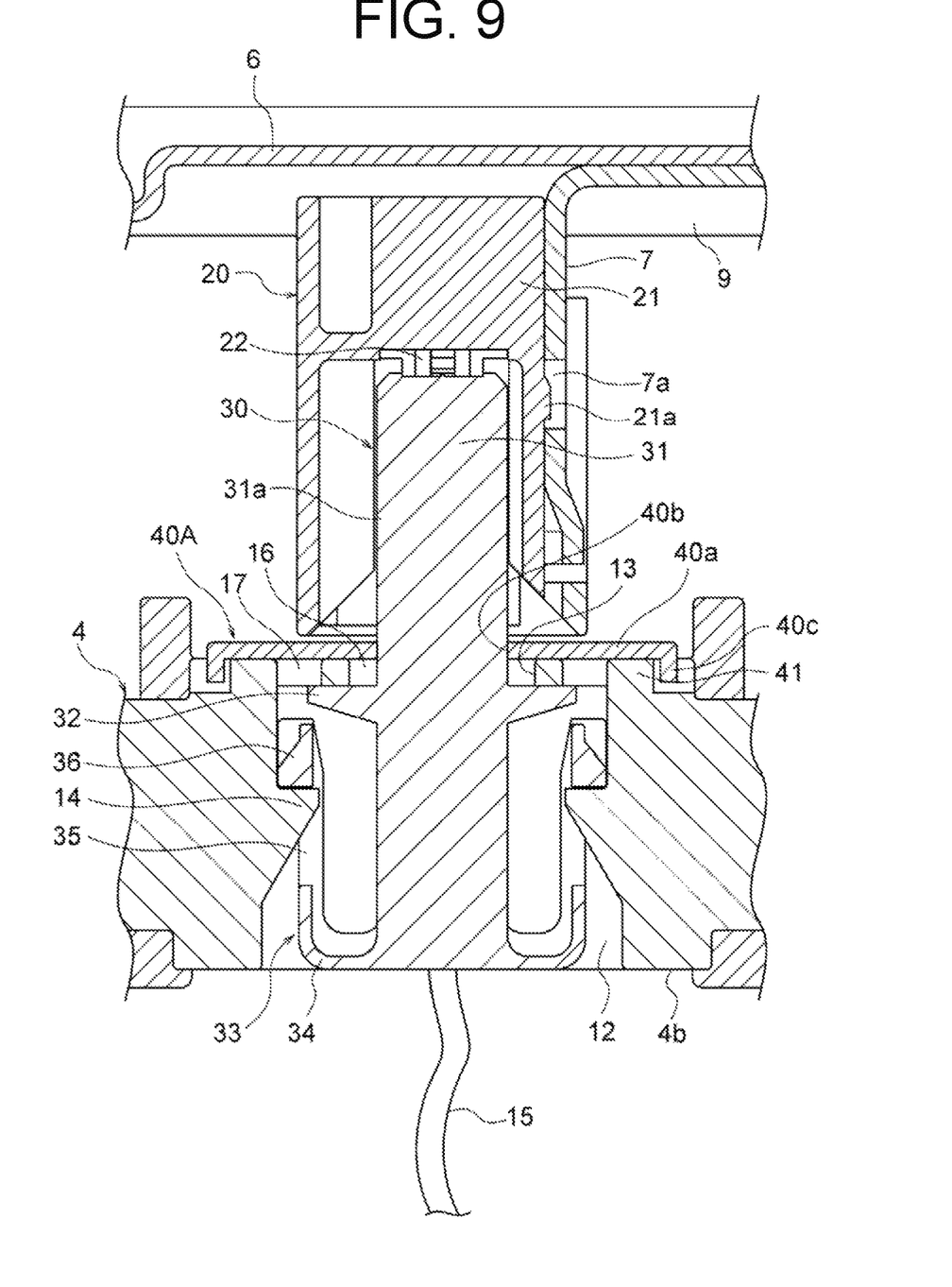
FIG. 9 is a sectional view for illustrating the dustproof structure of a terminal block in a power conversion device according to a second embodiment of the present invention.

FIG. 9 is a sectional view for illustrating the dustproof structure of a terminal block in a power conversion device according to a second embodiment of the present invention.

In FIG. 9, a protruding portion 41 is formed by causing a part of the top surface 4a of the terminal block 4 to protrude. The mounting bore 13 and the holes 17 are formed in this protruding portion 41. That is, a region including the mounting bore 13 and the holes 17 forms the protruding portion 41. A cover 40A is, for example, a resin molded body, and includes an annular peripheral wall portion 40c formed by bending an outer peripheral edge portion of the shielding portion 40a over an entire circumference toward one surface side at the right angle. Moreover, when the cover 40A is mounted to the swing-side housing 31, the peripheral wall portion 40c surrounds the outer peripheral wall surface of the protruding portion 41.

Other configurations are the same as those in the first embodiment described above.

The cover 40A is mounted to the swing-side interlock connector 30 by fitting the fitting hole 40b to the protruding portion 31a of the swing-side housing 31. As a result, the shielding portion 40a covers the gap 16 and the holes 17 as the terminal block 4 is seen from above. Therefore, also in the second embodiment, the same effects as those in the first embodiment described above are provided.

The annular peripheral wall portion 40c of the cover 40A surrounds the outer peripheral wall surface of the protruding portion 41 having the mounting bore 13 and the holes 17 formed therein. With this configuration, even when conductive foreign matter such as threading chips falls on the terminal block 4 during the repair and inspection operation performed while the waterproof lid 6 is removed, the conductive foreign matter is prevented from entering from the gap between the terminal block 4 and the cover 40A. As a result, it is possible to further suppress the occurrence of the short-circuit in the circuit on the circuit board and between the terminals of the power semiconductor elements caused by the entry of the conductive foreign matter.

In the first and second embodiments described above, the covers 40 and 40A are made of the resin, but the covers 40 and 40A may be made of metal.

Third Embodiment

Figure 10:
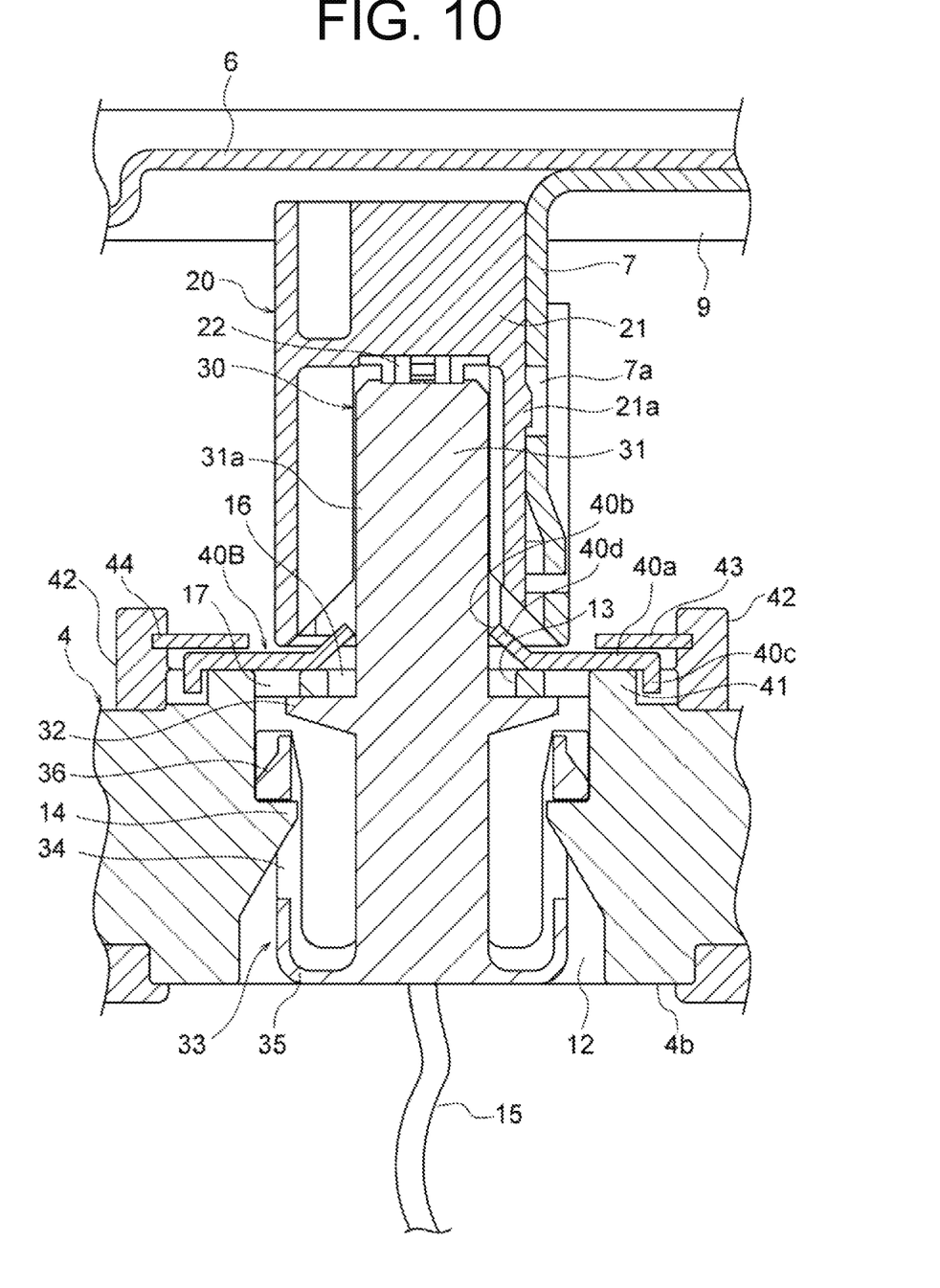
FIG. 10 is a sectional view for illustrating the dustproof structure of a terminal block in a power conversion device according to a third embodiment of the present invention.

FIG. 10 is a sectional view for illustrating the dustproof structure of a terminal block in a power conversion device according to a third embodiment of the present invention.

In FIG. 10, a cover 40B includes a tapered portion 40d formed by inclining a peripheral portion of the fitting hole 40b of the shielding portion 40a so as to gradually separate apart from the top surface 4a of the terminal block 4 toward the fitting hole 40b. The cover 40B is mounted to the swing-side housing 31 so that the protruding direction of the tapered portion 40d is set upward. A pair of fixing protrusions 42 are formed outside the protruding portion 41 on the top surface 4a of the terminal block 4 so as to be opposed to each other across the mounting bore 13. A retaining cover 43 is formed into a flat ring plate shape larger than the cover 40B. The retaining cover 43 is held by the pair of fixing protrusions 42 and 42 in a state in which an edge portion of the retaining cover 43 is inserted into holding grooves 44 formed in the pair of fixing protrusions 42 and 42. The retaining cover 43 held by the pair of fixing protrusions 42 and 42 covers at least an outer peripheral edge portion of the shielding portion 40a while the retaining cover 43 is in contact with or slightly spaced apart from a top surface of the shielding portion 40a of the cover 40B. In this configuration, the cover 40B is made of transparent resin, and the retaining cover 43 is made of colored resin.

Other configurations are the same as those in the second embodiment described above.

The cover 40B is mounted to the swing-side interlock connector 30 by fitting the fitting hole 40b to the protruding portion 31a of the swing-side housing 31. The shielding portion 40a covers the gap 16 and the holes 17 as the terminal block 4 is seen from above. Further, the peripheral wall portion 40c surrounds the outer peripheral wall surface of the protruding portion 41. Therefore, also in the third embodiment, the same effects as those in the second embodiment described above are provided.

The retaining cover 43 is mounted by being fixed to the pair of the fixing protrusions 42 and 42 so as to cover the outer peripheral edge portion of the shielding portion 40a of the cover 40B. As a result, the cover 40B is prevented from being pulled off by the retaining cover 43. With this configuration, the terminal block 4 into which the cover 40B and the retaining cover 43 are built in advance can be supplied to an assembly line for the power conversion device. As a result, a period of time and the number of assembly stations required on the assembly line for the power conversion device can be reduced, which provides an effect of reducing a production cost. Moreover, there is provided such an effect that the dustproof effect is further increased by adding the retaining cover 43.

Further, when the swing-side interlock connector 30 is mounted to the terminal block 4 on which the holding claw portions 14 for the snap-fit fixing are formed by molding, the protruding portion 31a of the swing-side housing 31 is guided by the tapered portion 40d of the cover 40B so as to be fitted to the fitting hole 40b. As a result, ease of assembly increases, and the effect of reducing production cost is provided through reduction in period of time required on the assembly line for the power conversion device.

Moreover, the cover 40B is made of the transparent resin. Thus, when the swing-side interlock connector 30 is mounted to the terminal block 4 on the assembly line for the power conversion device, an assembly worker can work while looking into the fitting hole 40b from the housing opening portion 5 side, to thereby visually recognize the protruding portion 31a of the swing-side housing 31. As a result, the ease of assembly increases, and the effect of reducing production cost is provided through reduction in period of time required on the assembly line for the power conversion device.

Moreover, there is provided such an effect that the retaining cover 43 is less likely to be unmounted during the assembly through use of the colored retaining cover 43 in contrast to the transparent cover 40B.

In the third embodiment described above, the cover 40B is used in place of the cover 40A, and the retaining cover 43 is added in the power conversion device according to the second embodiment, but the same effects are also provided by using the cover 40B in place of the cover 40, and adding the retaining cover 43 in the power conversion device according to the first embodiment.

Fourth Embodiment

Figure 11:
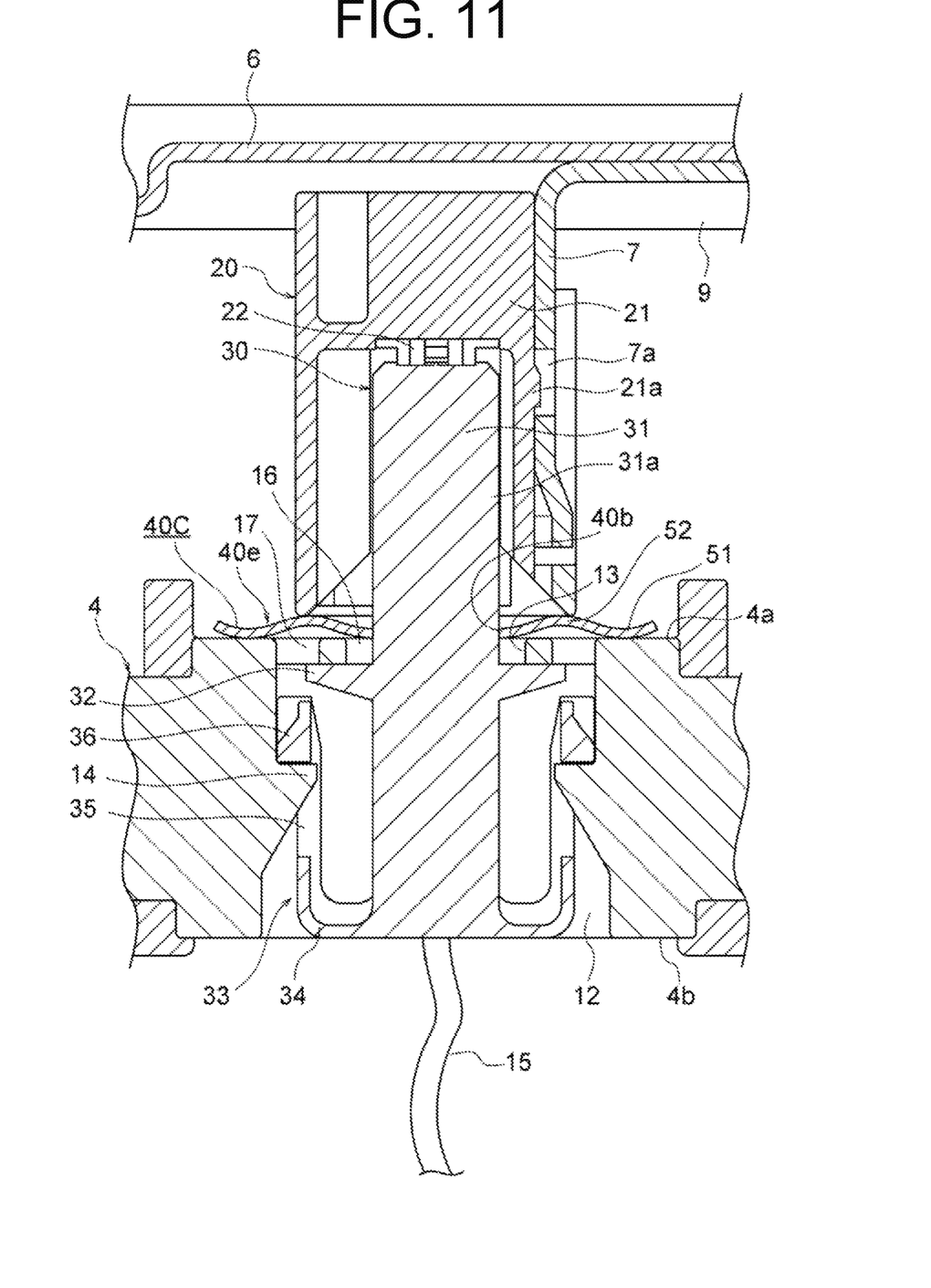
FIG. 11 is a sectional view for illustrating the dustproof structure of a terminal block in a power conversion device according to a fourth embodiment of the present invention.

FIG. 11 is a sectional view for illustrating the dustproof structure of a terminal block in a power conversion device according to a fourth embodiment of the present invention.

In FIG. 11, a cover 40C is formed into a ring shape by, for example, press-molding a flat plate made of an elastic body such as stainless steel. The cover 40C includes a shielding portion 40e and the fitting hole 40b. The shielding portion 40e has a ring shape. The fitting hole 40b is formed at a center of the shielding portion 40e. The shielding portion 40e is formed into a corrugated-plate shape in which crest portions 52 each having a gently protruding shape and trough portions 51 each having a gently recessed shape are concentrically arranged. The cover 40C is mounted to the swing-side interlock connector 30 by fitting the fitting hole 40b to the protruding portion 31a of the swing-side housing 31 protruding from the mounting bore 13. The shielding portion 40e covers the gap 16 and the holes 17 as the terminal block 4 is seen from above. When the waterproof lid 6 is mounted to the housing 3, the crest portions 52 of the shielding portion 40e are pressed against the fixed-side housing 21 of the fixed-side interlock connector 20. The trough portions 51 of the shielding portion 40e are pressed against the top surface 4a of the terminal block 4. As a result, the shielding portion 40e is elastically deformed, and is sandwiched between the fixed-side housing 21 and the terminal block 4 while the shielding portion 40e is in contact with the fixed-side housing 21 and the top surface 4a of the terminal block 4. Moreover, elastic resin such as silicon resin is formed on a surface of the cover 40C.

The other configurations are the same as those in the first embodiment described above.

In the fourth embodiment, the cover 40C is mounted to the swing-side interlock connector 30, and the shielding portion 40e covers the gap 16 and the holes 17 as the terminal block 4 is seen from above. Therefore, also in the fourth embodiment, the same effects as those in the first embodiment described above are provided.

The shielding portion 40e of the cover 40C is formed into the corrugated plate of the ring shape in which the crest portions 52 and the trough portions 51 are concentrically formed. The shielding portion 40e is held in the elastically deformed state between the fixed-side interlock connector 20 and the terminal block 4 when the waterproof lid 6 is mounted to the housing 3. As a result, the shielding portion 40e is in contact with the top surface 4a of the terminal block 4 in the state in which the shielding portion 40e is pressed toward the terminal block 4 side. As a result, it is possible to prevent conductive foreign matter such as threading chips accidentally fallen on the terminal block 4 during the repair and inspection from rolling by, for example, vibrations from the running vehicle, and entering the inside of the housing 3 from the gap between the terminal block 4 and the cover 40C.

The elastic resin is formed on the surface of the cover 40C, and the cover 40C is thus in close contact with the top surface of the terminal block 4. Therefore, the conductive foreign matter is prevented from entering the inside of the housing 3.

Description has been given of the power conversion device in the respective embodiments described above, but the same effects are provided when the present invention is applied to electrical devices.

REFERENCE SIGNS LIST 1 external harness, 1a terminal, 2 external harness, 2a terminal, 3 housing, 4 terminal block, 4a top surface, 4b bottom surface, 5 housing opening portion, 6 waterproof lid, 8 bolt, 12 mounting hole portion, 13 mounting bore, 14 holding claw portion, 15 harness, 16 gap (gap portion), 17 hole (gap portion), 19 electrical connection portion, 20 fixed-side interlock connector, 30 swing-side interlock connector, 31 swing-side housing, 31a protruding portion, 40, 40A, 40B, 40C cover, 40b fitting hole, 40c peripheral wall portion, 40d tapered portion, 41 protruding portion, 42 fixing protrusion, 43 retaining cover, 51 trough portion, 52 crest portion.

The invention claimed is:
1. An electrical device, comprising:
a housing;
a terminal block which is provided in the housing, and includes an electrical connection portion on a top surface;
an external harness having a terminal fastened with bolts to the electrical connection portion so as to be fixed to the terminal block in a state in which the external harness is inserted into the housing;
a housing opening portion formed in the housing so as to be opposed to the top surface of the terminal block, and to expose the electrical connection portion;
a lid mounted to the housing so as to close the housing opening portion;
a swing-side interlock connector mounted to the terminal block; and
a fixed-side interlock connector mounted to the lid, and configured to bring harnesses connected to the swing-side interlock connector into a short-circuit state when the lid is mounted to the housing, and to release the short-circuit state between the harnesses when the lid is removed from the housing, wherein the terminal block includes a mounting hole portion which is formed so as to be opened in a bottom surface and a mounting bore formed so as to be opened in the top surface, and connects the mounting hole portion and an outside of the top surface to each other, wherein the swing-side interlock connector includes a swing-side housing which is mounted inside the mounting hole portion, and protrudes from the mounting bore, wherein a cover is placed on the top surface of the terminal block by fitting a fitting hole to a protruding portion of the swing-side housing protruding from the mounting bore, and wherein a gap portion which is formed around the protruding portion, and connects the mounting hole portion and the outside of the top surface to each other is covered with the cover as viewed from the side of the housing opening portion.

2. The electrical device according to claim 1, wherein the gap portion has a gap formed between the mounting bore and the protruding portion.

3. The electrical device according to claim 1,
wherein the terminal block is a resin molded body, and includes a holding claw portion configured to use snap-fit to fix the swing-side interlock connector, and
wherein the gap portion includes a hole which passes through the terminal block, and is formed to mold the holding claw portion in an undercut shape in terms of a mold configuration.

4. The electrical device according to claim 1, further comprising:
a protruding portion formed by causing a region including the mounting bore and the gap portion to protrude from the top surface of the terminal block; and
a peripheral wall portion protruding from an outer peripheral edge portion of the cover over an entire circumference toward one surface side, to surround an outer peripheral wall surface of the protruding portion.

5. The electrical device according to claim 1, further comprising:
a fixing protrusion formed outside the mounting bore;
a tapered portion formed by inclining a peripheral portion of the fitting hole of the cover so as to be spaced apart from the top surface toward the fitting hole; and
a retaining cover fixed to the fixing protrusion so as to be arranged on an outer peripheral edge portion of the cover, to prevent the cover from being pulled off.

6. The electrical device according to claim 5, wherein the cover is transparent, and the retaining cover is colored.

7. The electrical device according to claim 1,
wherein the cover is an elastic body of a corrugated-plate shape having crest portions and trough portions of corrugation concentrically arranged about a center of the fitting hole, and
wherein the cover is sandwiched in an elastically deformed state between the fixing-side interlock connector and the top surface of the terminal block in a state in which the lid is mounted to the housing.

8. The electrical device according to claim 7, wherein elastic resin is formed on a surface of the cover.

* * * * *